(12) United States Patent
Sanchez

(10) Patent No.: US 7,738,796 B2
(45) Date of Patent: Jun. 15, 2010

(54) METHOD AND APPARATUS FOR DIGITAL SIGNAL PROCESSING ENHANCED LASER PERFORMANCE COMPENSATION

(76) Inventor: Jorge Sanchez, 15655 Oakstand Rd., Poway, CA (US) 92064

( * ) Notice: Subject to any disclaimer, the term of this patent is extended or adjusted under 35 U.S.C. 154(b) by 404 days.

(21) Appl. No.: 10/561,546

(22) PCT Filed: Apr. 21, 2005

(86) PCT No.: PCT/US2005/013561

§ 371 (c)(1), (2), (4) Date: Dec. 19, 2005

(87) PCT Pub. No.: WO2005/104315

PCT Pub. Date: Nov. 3, 2005

(65) Prior Publication Data

US 2006/0159142 A1 Jul. 20, 2006

Related U.S. Application Data

(60) Provisional application No. 60/564,143, filed on Apr. 21, 2004.

(51) Int. Cl.
*H04B 10/04* (2006.01)
(52) U.S. Cl. .................. 398/197; 398/195; 398/198
(58) Field of Classification Search ............... 398/32, 398/162, 195, 196, 197, 198
See application file for complete search history.

(56) References Cited

U.S. PATENT DOCUMENTS

| 4,164,036 A | * | 8/1979 | Wax ............................. 702/74 |
| 4,168,398 A | * | 9/1979 | Matsuo et al. ............... 370/324 |
| 4,471,494 A | | 9/1984 | Keil et al. |
| 4,994,675 A | * | 2/1991 | Levin et al. .................. 250/551 |
| 5,153,765 A | | 10/1992 | Grunziger et al. |
| 5,268,916 A | * | 12/1993 | Slawson et al. ........ 372/29.021 |
| 5,526,164 A | * | 6/1996 | Link et al. .................. 398/195 |
| 5,579,328 A | * | 11/1996 | Habel et al. .................... 372/31 |

(Continued)

FOREIGN PATENT DOCUMENTS

WO    WO 03/067510    8/2003

OTHER PUBLICATIONS

-International Search Report for PCT/US2005/013561 completed Aug. 24, 2005 from the EPO.
Smith D W et al; "Laser Level Control for High Bit Rate Optical Fibre Systems" Proceedings of the International Symposium on Circuits & Systems, Houston, Apr. 28-30, 1980, New York, IEEE, US vol. 1, Conf. 13, 4/80 pp. 926-930.

(Continued)

*Primary Examiner*—Nathan M Curs
(74) *Attorney, Agent, or Firm*—Schwabe, Williamson & Wyatt, P.C.

(57) ABSTRACT

Methods for controlling lasers or other light emitting devices to compensate for performance degradations due to temperature changes and aging without disrupting the transmission of information are presented. Disclosed embodiments describe various methods of applying mathematical models and digital signal processing algorithms to continuously calculate and execute precise output power adjustments. A synthesized test signal is injected into the normal data stream is applied to the laser system. The magnitude of the test signal is sufficiently small that it is buried in system noise and will not alter the noise margin of the signal or the transmitted data. Microdetection, recovery and digital signal processing of the embedded test signal produces precisely monitored output power and modulation amplitude measurements used to accurately adjust performance characteristics regardless of temperature or age.

8 Claims, 8 Drawing Sheets

U.S. PATENT DOCUMENTS

| | | | |
|---|---|---|---|
| 5,812,572 A * | 9/1998 | King et al. | 372/38.04 |
| 5,889,802 A * | 3/1999 | Walker | 372/31 |
| 5,949,606 A * | 9/1999 | Kaaden et al. | 360/77.14 |
| 6,282,218 B1 | 8/2001 | Anderson | |
| 6,370,175 B1 | 4/2002 | Ikeda et al. | |
| 6,731,586 B2 | 5/2004 | Seo et al. | |

OTHER PUBLICATIONS

Non-final OA dated Jul. 23, 2007 for U.S. Appl. No. 11/111,335.
International Search Report for PCT/US03/00463 dated Jul. 30, 2003.

* cited by examiner

FIG. 8

Signal Processing math $V_1 = \{B*Sin(wt+\theta_2) + Noise\} * \{A*Sin(wt+\theta_1)\}$ $V_1 = (AB/2)\{Cos(\theta_1-\theta_2) - Cos(2wt+\theta_1+\theta_2)\} + Noise$ $V_2 = (AB/2) * \{Cos(\theta_1-\theta_2)\} = (AB/2) * \{Cos(\theta_2-\theta_1)\}$ $V_3 = \{(A^2B^2)/4\} * \{Cos^2(\theta_2-\theta_1)\}$ $V_4 = \{B*Sin(wt+\theta_2) + Noise\} * \{A*Cos(wt+\theta_1)\}$ $V_4 = (AB/2)\{Sin(\theta_2-\theta_1) + Sin(2wt+\theta_2+\theta_1)\} + Noise$ $V_5 = (AB/2) * \{Sin(\theta_2-\theta_1)\}$ $V_6 = \{((A^2B^2)/4\} * \{Sin^2(\theta_2-\theta_1)\}$ $V_7 = V_3 + V_6 = \{(A^2B^2)/4\} * \{Sin^2(\theta_2-\theta_1) + Cos^2(\theta_2-\theta_1)\} = (A^2B^2)/4$ $V_8 = \{(A^2B^2)/4\} * (4/A^2) = B$ Laser Slope = B/A

METHOD AND APPARATUS FOR DIGITAL SIGNAL PROCESSING ENHANCED LASER PERFORMANCE COMPENSATION

CROSS-REFERENCE TO RELATED APPLICATIONS

This application is a National Stage of PCT/US2005/013561, filed Apr. 21, 2005, which claims the benefit of U.S. Provisional Application No. 60/564,143, filed Apr. 21, 2004.

BACKGROUND

1. Field

The presently disclosed embodiments relate generally to laser control, and more specifically to laser performance compensation for aging and temperature changes.

2. Background

Lasers are increasingly used in systems such as high speed communications links, fiber optic channels and medical diagnostics. Market trends demand increased levels of reliability and performance in laser systems. Lasers having signals with accurate output power and signal amplitude are required to meet these performance demands.

Individual lasers exhibit significant variations in performance characteristics when they are newly manufactured. Additionally, all lasers substantially degrade in performance with age and changes in temperature. Performance degradation causes a reduction in output power and signal strength, resulting in decreased Signal to Noise Ratios (S/Ns) and Extinction Rates, as well as increased Bit Error Rates (BERs).

Communications receivers require that signals maintain acceptable signal strength and reliable operating parameters. In order to generate transmission signals that meet receiver requirements, lasers must be adjusted to compensate for individual variations and performance degradations occurring over time.

Various conventional methods are used to compensate for changes in laser performance characteristics. Conventional performance compensation methods have drawbacks such as communication disruption and non-optimal output power adjustments. Non-optimal power adjustments may produce inaccurate output signals that are difficult to receive, and frequently overdrive the laser, reducing its life.

Before adjustments can be made for performance degradations caused by aging and temperature changes, output power and temperature must be accurately monitored. The output power of many lasers available today is monitored with photodiodes that are integrated with the laser in a single package. The photodiodes may also be a component of an integrated circuit that is associated with the laser's driver or a Vertical Cavity Surface Emitting Laser (VCSEL) array. For economic reasons, it is common to utilize very slow photodiodes for monitoring the laser output. In some cases the photodiodes exhibit a frequency response that is several orders of magnitude lower than the frequency response of the laser. Photodiodes with frequency responses that are slower than the lasers they monitor can reliably measure the laser's average power output, but pose a problem in determining the amplitude of the optical pulses for transmitting information. The amplitudes of optical pulses cannot be measured because the photodiode will not generate significant output in response to the Alternating Current (AC signal) output representing data transmission.

In digital communications, it is necessary to monitor the amplitude of the optical pulses in order to distinguish the transmission of a logical one from the transmission of a logical zero. In both analog and digital communications, the magnitude of the optical signal represents the strength of the signal and has a direct impact on signal to noise ratio and transmission reliability. Because sensing power output with low frequency response photodiodes permits only the average power of the laser, rather than the amplitude of data transmission light pulses to be monitored, accurate power output feedback information is not available to adjust the magnitude of optical pulses representing the data. Without accurate amplitude feedback information, output power cannot be properly controlled, causing the Optical Modulation Amplitude, Extinction Ratio and BER to degrade with temperature changes as well as aging.

To perform an accurate power measurement with a slow photodiode, an input power signal must be maintained at a fixed power level causing the system to produce a constant value of light output, which is always equal to the measurable average power value. Since the slow photodiode can't be relied upon to determine the output power of a high frequency signal, other methods have been employed. For example, one method commonly used consists of applying a signal with known amplitude to the laser transmitter while a measurement is made of the resulting output power with an instrument instead of a photodiode. The measurement instrument used is one that can respond to high frequency of light power transitions. This procedure disrupts the signal transmission preventing the transmitter from sending information over the communications channel while adjustments are carried out. Disruption in communication is contrary to the goals of high reliability and 100% up-time in present systems.

Another example of an intrusive power adjustment method is an approach that relies on the application of a tone signal to the laser. The tone is recovered by the monitor photodiode and the recovered signal used to determine changes in laser performance. This method is disadvantageous because, again, the tone disrupts the transmitted signal because the magnitude of the tone signal is of similar magnitude to the magnitude of the transmitted signal. Disruption also causes a significant reduction of the noise margin, which renders this approach inaccurate.

Temperature sensors are commonly utilized to determine when performance adjustments are appropriate due to changes in temperature. Conventional reliance on temperature sensors is also problematic. Temperature sensors, unlike photodiodes, are not commonly integrated with laser or driver devices. The temperature sensor must be mounted at a location external to the laser itself, producing a measurement that is poorly correlated to the actual operating temperature of the laser. The problem is then compounded when inaccurate temperature measurements are used as indexes to determine power adjustments from equally unreliable look-up tables.

Look-up tables are created at the factory for each laser manufactured. Each laser must have its own look-up table because the performance characteristics of each unit differ with variations in constituent parts and manufacture. This method of creating temperature lookup tables requires a costly process on the production line to heat each laser in an environmental chamber at incremental temperatures. Large numbers of test temperature samples produced by small temperature increments, which are necessary for accurate interpolation, increase the production cost. The table is populated with a bias and modulation current for each temperature tested, unique to the particular laser. Even this labor-intensive effort cannot produce an accurate table because the table cannot compensate for aging. Aging cannot be predicted ahead of time with the required level of individual precision to create a table of aging values for a given laser. In some cases, Manufacturers resort to tightening the performance specifications for the laser system so it will still perform adequately after aging degradation. The result of the tightening of the specification is a lower manufacturing yield for the components used in the laser system, which increases costs.

Conventional methods of compensating for degradations in laser output power are inadequate because temperature and output power measurement methods rely on external physical devices that produce inaccurate feedback information. Costly labor intensive look-up tables do not produce reliable results because temperature indexes are poorly correlated to actual laser operating temperatures, and the effects of aging cannot be accurately predicted for individual lasers. Thus, there is a need in the art for improved methods of laser performance monitoring and compensation, which do not employ external measurement components and inaccurate lookup tables or disrupt transmitted data throughput.

SUMMARY

Embodiments disclosed herein address the above-stated needs by providing methods and apparatus for implementing mathematical models and digital signal processing algorithms that compensate for aging, temperature linearity, and other performance characteristics without affecting or disrupting the transmitted signal. These embodiments accurately determine laser parameters at any temperature, age, or transmission speed in a non-invasive and non-disruptive manner. Closed loop servos and feedback techniques which rely on signal processing continuously provide Extinction Rate and Optical Modulation Amplitude measurements while data is being transmitted. In addition to space and power savings, temperature sensors and Integrated Circuits for monitoring bias and modulation currents are made obsolete by the present invention.

Methods and circuits are presented, for simplicity, as they apply to lasers. However, similar methods and circuits applying to any type of light emitting device such as LEDs, lamps or fluorescent lights would be readily apparent to one skilled in the art.

Accordingly, in one aspect, a method for controlling a light emitting device including modulating a light emitting device with a noise-level test signal to produce a modulated signal output, acquiring the modulated signal from the light emitting device, extracting the noise-level test signal from the acquired signal, digitally processing the extracted noise-level test signal to calculate power control adjustments and controlling output power of the light emitting device by applying the calculated power control adjustments to the light emitting device is described.

In another aspect, a method for controlling a laser including generating a noise-level test signal having a multitude of characteristics, modulating a laser with the generated noise-level test signal to produce a modulated output signal, acquiring the modulated output signal, extracting a noise-level test signal from the acquired modulated output signal, determining a power characteristic of the extracted noise-level test signal, determining a characteristic slope of the laser from the extracted noise-level test signal, calculating a bias current adjustment from the power characteristic of the extracted noise-level test signal, calculating a modulation current adjustment from a ratio of the characteristic slope of the generated noise-level test signal to the characteristic slope of the extracted noise-level test signal, controlling a laser bias current by applying the calculated bias current adjustment to a laser driver and controlling a laser modulation current by applying the calculated modulation current adjustment to the laser driver is also described.

BRIEF DESCRIPTION OF THE DRAWINGS

FIG. 8 describes the mathematics for the signal processing functions.

DETAILED DESCRIPTION

Figure 1:
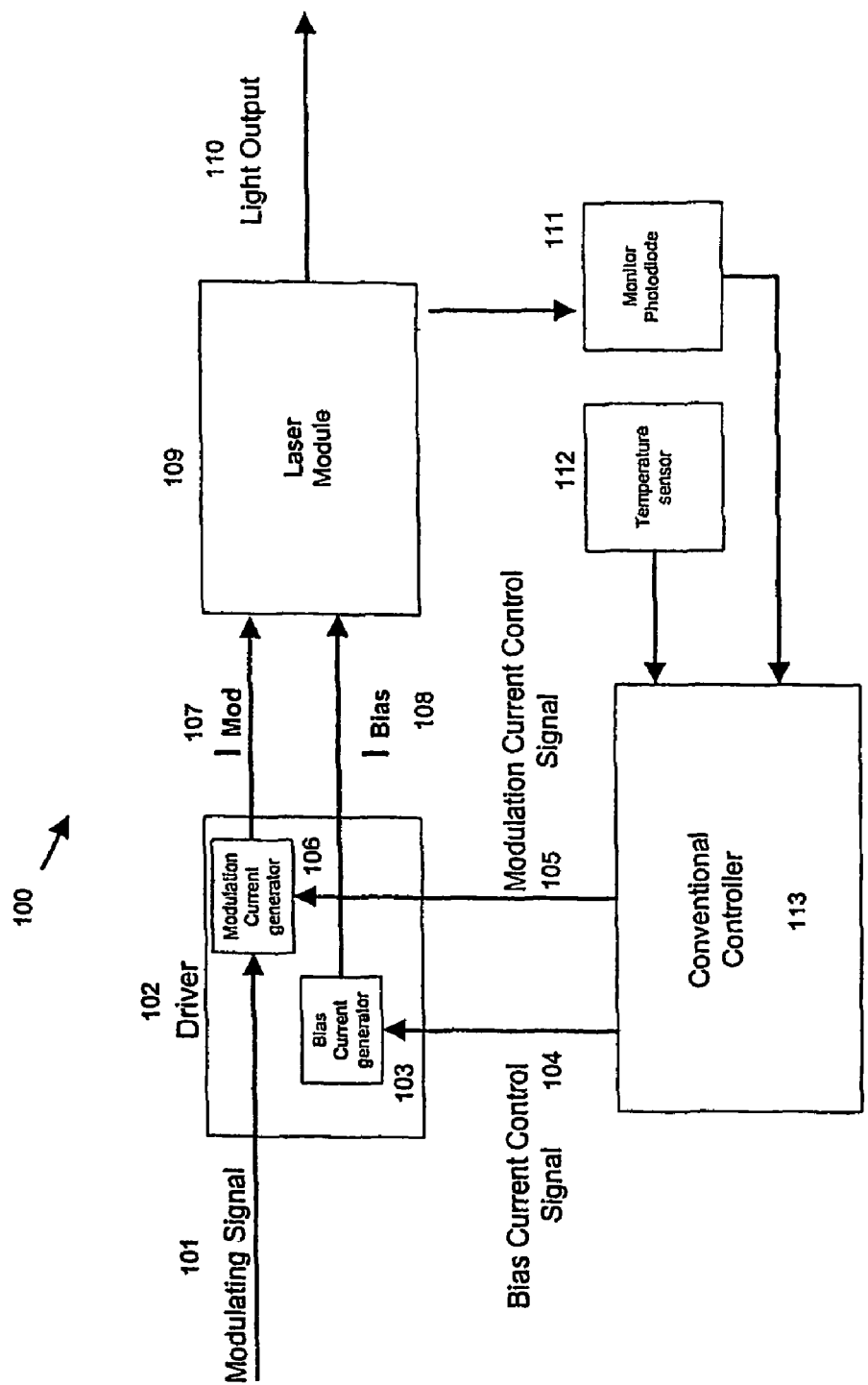
FIG. 1 is a block diagram of a conventional laser control system.

The disclosed embodiments present methods for controlling lasers or other light emitting devices to compensate for performance degradations due to temperature changes and aging without disrupting the transmission of information. The disclosed embodiments describe various methods of applying mathematical models and digital signal processing algorithms to continuously calculate and execute precise output power adjustments.

A method for embedding a synthesized test signal in a normal data carrying signal applied to the laser system is described. The magnitude of the test signal is sufficiently small that it is buried in system noise and will not alter the noise margin of the signal or the transmitted data. Recovery and processing of the embedded test signal produces precisely monitored output power and signal amplitude measurements used to accurately adjust performance characteristics regardless of temperature or age. Digital signal processing performance compensation methods of the present invention disclosed herein comprise phase sensitive, phase insensitive and signal sweep algorithms.

A digital signal processing enhanced method for optical link transmission performance compensation is also disclosed. The use of fiber optic links for performing adjustments to laser characteristics is further disclosed in U.S. Pat. No. 6,446,867, entitled "ELECTRO-OPTIC INTERFACE SYSTEM AND METHOD OF OPERATION", which is assigned to the assignee of the present invention and fully incorporated herein by reference. Finally, another method utilizing a high frequency photodiode is also disclosed.

Exemplary embodiments may be implemented as electronic hardware, computer software, or combinations of both. The word "exemplary" is used exclusively herein to mean "serving as an example, instance, or illustration." Any embodiment described herein as "exemplary" is not necessarily to be construed as preferred or advantageous over other embodiments.

The features, objects, and advantages of the disclosed embodiments will become more apparent from the detailed description set forth below when taken in conjunction with the drawings in which like reference characters identify correspondingly throughout and wherein:

FIG. 1 illustrates a conventional laser control system. A typical conventional system includes an analog or mixed analog and digital Controller 113 for controlling a laser Driver 102. The Driver 102 comprises a Bias Current Generator 103 for generating a Bias Current 108, and a Modulation Current Generator 106 for generating a Modulation Current 107. The Controller 113 applies Bias Current Control Signal 104 and Modulation Current Control Signal 105 to the Driver 102 to cause the Bias Current Generator 103 and Modulation Current Generator 106 to produce the appropriate magnitude of Bias Current 108 and Modulation Current 107 respectively. The Bias Current 108 and Modulation Current 107 are applied to Laser Module 109, which accordingly produces Light Output 110.

A typical conventional Controller 113 relies on externally mounted Temperature Sensor 112 to determine when performance adjustments are appropriate due to changes in temperature, and for generating an index into factory generated lookup tables. The Controller 113 relies on low frequency response Monitor Photodiode 111 to sense the average power of the Laser Module's 109 Light Output 110.

Figure 2:
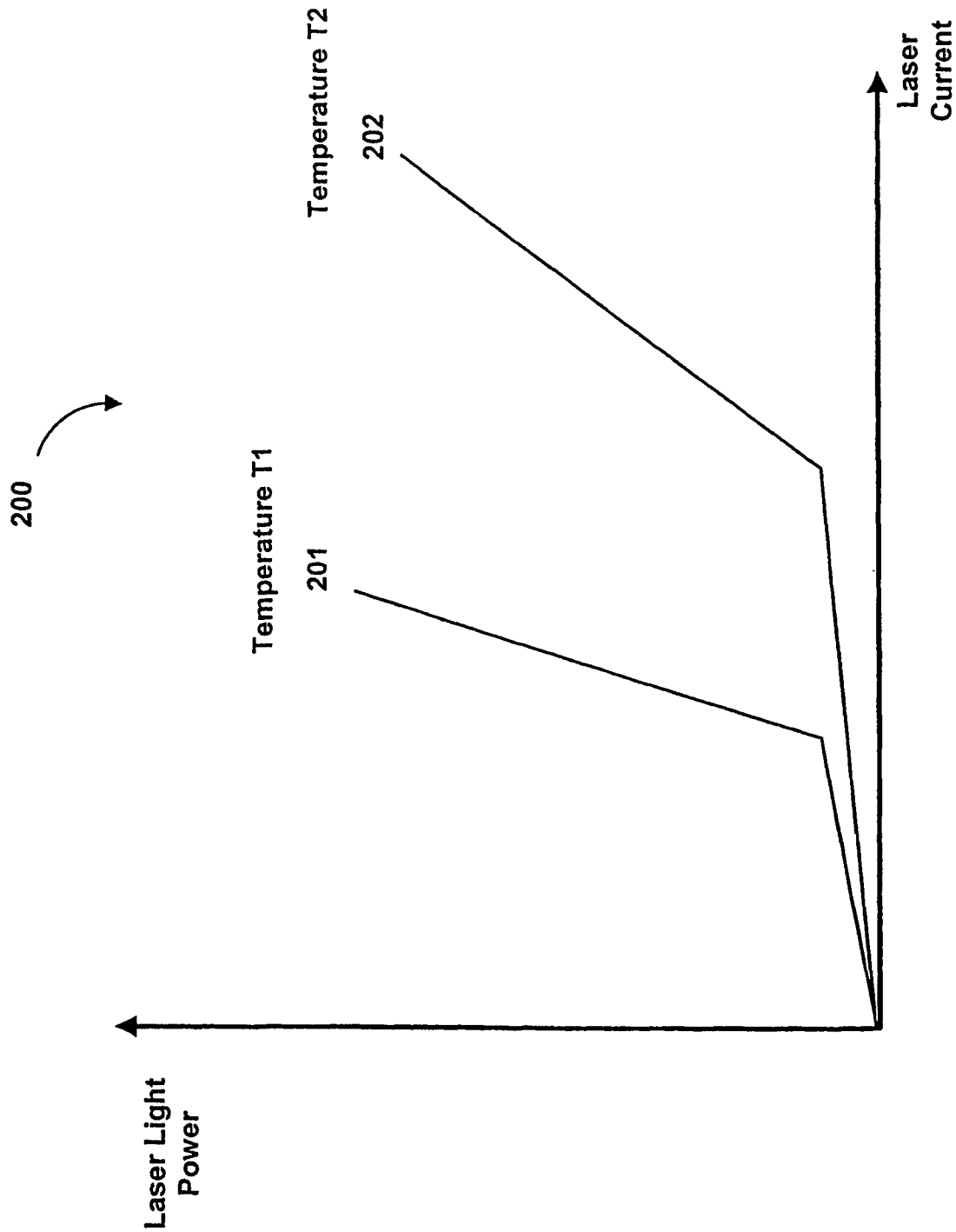
FIG. 2 illustrates conventional variations in characteristic current with respect to laser light output power at different temperatures in accordance with conventional laser control systems.

FIG. 2 graphically illustrates variations in characteristic laser current with respect to laser light output power at different temperatures in accordance with conventional laser control systems illustrated by FIG. 1. Characteristic input current with respect to laser light output power 201 corresponds to a new laser at a first temperature T1. Characteristic input current with respect to laser light output power 202 corresponds to an aged laser at a second temperature T2. Control of the laser is initially set so that a given amount of light power and signal modulation is obtained with input current characteristic 201. When the characteristic changes to characteristic 202 with aging and temperature variations, the initial input current setting produces an incorrect amount of light output power and diminished signal amplitude. Incorrect low levels of light output power reduce the signal strength and signal to noise ratio of the transmitted signal. Incorrect high levels of light output power over drive the laser, shortening its life.

Figure 3:
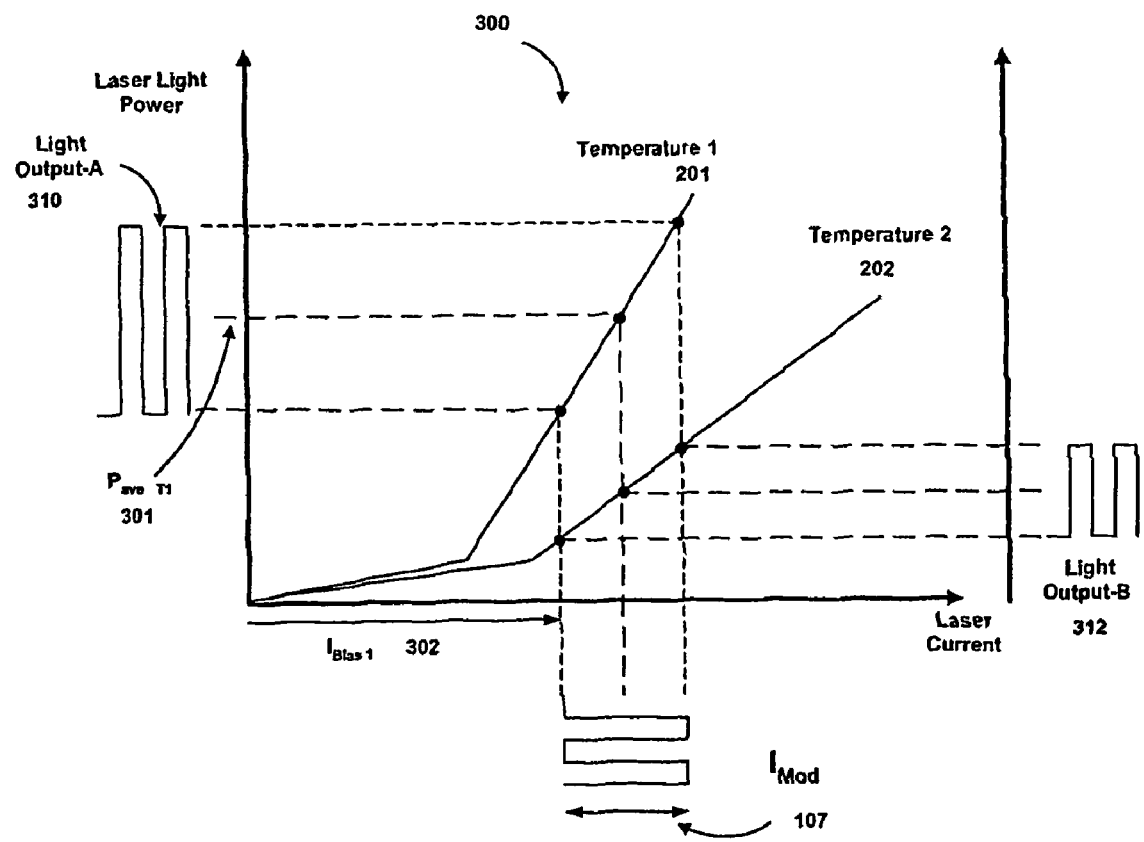
FIG. 3 illustrates reduced output power of transmitted waveforms with variation in temperature in accordance with conventional laser control systems.

FIG. 3 graphically illustrates reduced output power of transmitted waveforms with variation in temperature 300, in accordance with conventional laser control systems illustrated by FIG. 1. Characteristic current with respect to light output 201 corresponds to the overall laser response at Temperature T1, producing output having an amplitude of Light Output A 310. Characteristic current with respect to light output 202 corresponds to the overall laser response at Temperature T2, producing output having an amplitude of Light Output B 312. FIG. 3 shows how output amplitudes (310,312) vary directly with changes in the slope of the characteristic current at different temperatures. When the characteristic slope changes, the signal amplitude and average power output are diminished.

Threshold current is applied to a laser upon power up. A laser's threshold current is the minimum current required to produce light output. However, lasers are not operated near their thresholds because doing so produces noisy unstable output. Therefore, a margin current is added to the threshold current to produce a total Bias current IB1 302. Application of a laser's bias current 302 places the laser in its proper operating range.

Modulation current 107 is then added to the bias current to produce light output pulses representing data (310,312). The slope of the current characteristic (201,202) is determined by its threshold and operating range. As the slope of the current characteristic changes with temperature from T1 to T2, the operating range, requiring a different threshold, is also reduced. As the operating range of the laser becomes smaller with temperature drift that shifts the characteristic of the laser's response from characteristic 201 to characteristic 202, the amplitude of the Light Output A 310 is reduced to the amplitude of Light Output B 312. This light output reduction occurs even though the applied Modulation current 107 has not been altered.

Embodiments of the present invention detailed in FIGS. 4-8 enable the Temperature 1 characteristic 201, and hence light output-A 310 in FIG. 3, to be maintained regardless of changes in temperature or age. Characteristic drift that changes the slope of current characteristics and reduces light output is prevented by continuously and accurately monitoring and adjusting input bias and modulation current using digital signal processing techniques.

Figure 4:
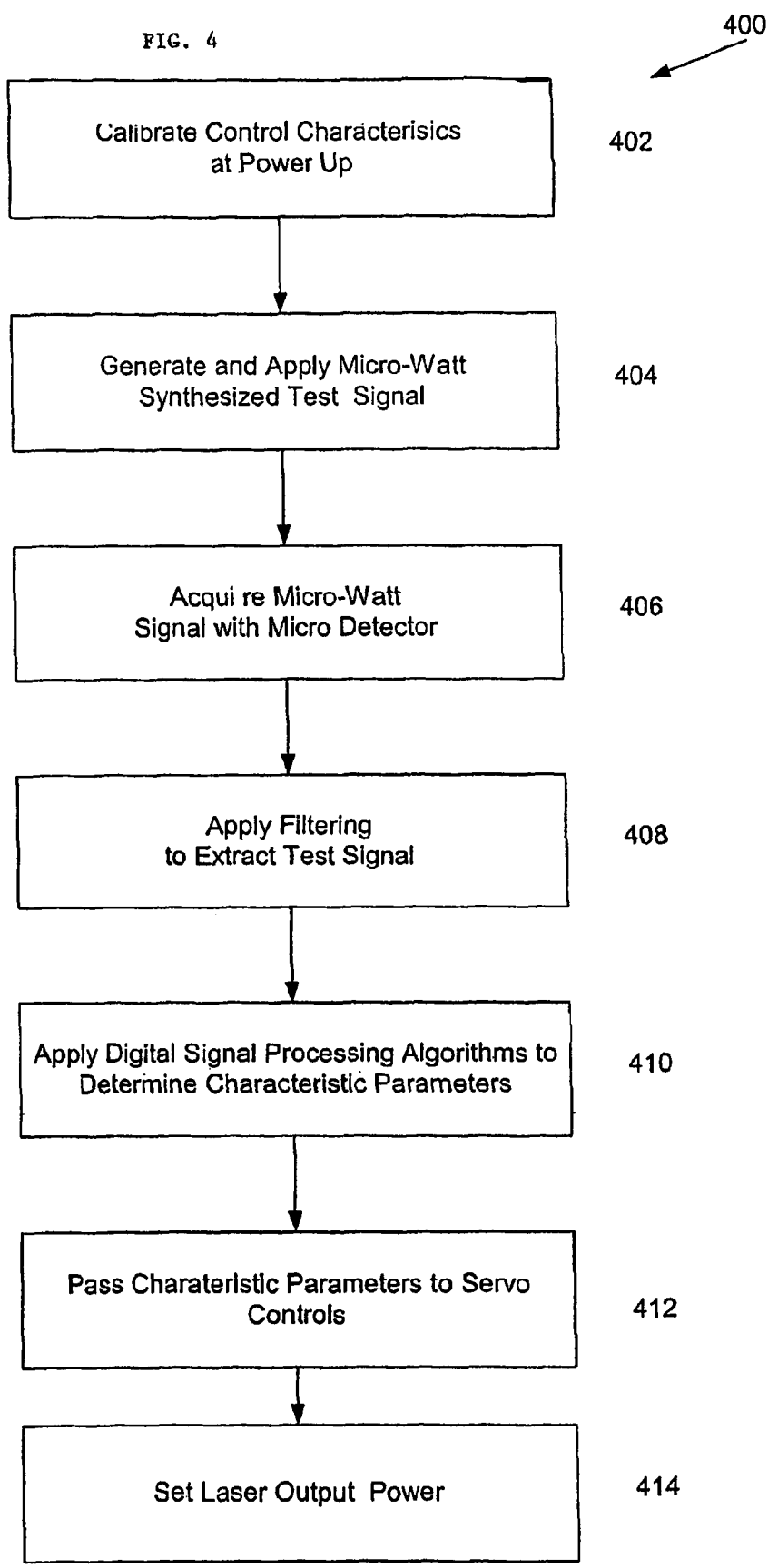
FIG. 4 is a high level step diagram for digital signal processing methods of laser performance compensation in accordance with the present invention.

FIG. 4 is a high level flowchart diagram for novel digital signal processing methods of laser performance compensation 400 in accordance with various embodiments of the present invention. In step 402, a control path comprising a digital controller, laser driver, laser, monitor photodiode, signal conditioner and optional Analog to Digital (A/D) converter is initially calibrated. Control flows to step 404.

In step 404, a Digital Signal Processor (DSP) generates and applies a synthesized sinusoidal noise-level test signal to the laser driver. Noise levels for communication systems are typically in the micro-watt range. However, a test signal of any level commensurate with a system's noise maybe applied without departing from the scope of the present invention. The noise-level test signal becomes embedded in system noise as the driver modulates the bias current with the test signal and transmit data. The driver applies the modulated signal containing data, noise, and embedded test signal to the laser. Control flows to step 406.

In step 406, a micro-detector implemented in a DSP analyzer function acquires the embedded test signal (i.e. the noise-level test signal buried in system noise). In one embodiment, the DSP analyzer utilizes a phase sensitive lock-in detection algorithm to multiply the acquired test signal by a copy of the originally injected sinusoidal test signal. The mathematical operation of multiplying two sinusoids yields a Direct Current (DC) value proportional to the amplitude of the two sinusoids divided by two times a phase factor, plus harmonics. The phase factor is dependent on the phase shift between the applied test signal and the detected signal. This factor may be negligible in many cases. Multiplying the two sinusoidal signals produces the amplitude of the injected test signal, and also shifts the frequencies of the harmonics and noise such that the acquired sinusoidal test signal can be extracted by filtering it from the other unwanted components of the mathematical product.

The DSP analyzer functions may be embodied directly in hardware, firmware, software, or in a combination of the above. Control flows to step 408.

In step 408, after acquisition of the system test signal embedded in noise, the DSP analyzer applies an ultra low bandwidth low pass filter to eliminate harmonics and noise from the acquired signal. Thus, the acquired noise-level test signal is extracted from the system noise and fully recovered.

In another embodiment of steps 406 and 408, the DSP analyzer acquires the embedded test signal utilizing a phase insensitive quadrature detection algorithm. Quadrature detection advantageously eliminates a phase shift of the acquired test signal with respect to the originally applied test signal created by the sinusoidal multiplication of the previous embodiment.

The quadrature detection method splits the acquired signal into two signals. One signal is multiplied by a sine function term and the other signal is multiplied by a cosine function term. A low pass filter is then applied to both signals to filter high frequency harmonics and noise, recovering a sinusoidal and a cosinusoidal test signal. Both signals are then squared, producing a sine squared test signal and a cosine squared test signal. Sine squared and cosine squared signals universally add to one. The sine squared and cosine squared test signals are added, producing the amplitude of the acquired test signal. The amplitude of the acquired test signal is the average power of the recovered test signal.

In yet another linear sweep embodiment of steps 406 and 408 advantageous for performance compensation in VCSELS, a gradually increasing noise-level saw tooth test signal, rather than a sinusoid, is applied to the laser driver. This saw tooth test signal incrementally increases the bias current by noise-level amounts over a very narrow region. The recovered test signal is sampled to produce a set of noise-level data points as the bias current incrementally increases by miniscule amounts. A linear regression, or least squares best fit, algorithm is applied to these data points to produce a characteristic line. Control flows to step 410.

In step 410, after recovery of the synthesized noise-level test signal, the DSP analyzer function determines the laser's characteristics by processing the recovered test signal. The efficiency slope, and threshold inflection point of the laser characteristic are determined by mathematical process. Output power control parameters are updated for use by servo function in step 414 according to the presently calculated laser characteristics.

Control parameters are produced for adjustment of modulation current. The amplitude of the laser's modulation is determined by its characteristic slope (See FIG. 3). Hence, modulation current adjustment parameters are calculated by determining the ratio of the slope of the originally applied test signal to the slope of the recovered test signal.

Control parameters are produced for adjustment of bias current by continuously monitoring the average power output of the test signal. Control flows to step 412.

In step 412, the updated modulation and bias current control parameters are passed to respective modulation current and bias current servo control functions.

A servo is a functionality used to control and maintain a given variable in a system. A first element of a servo is the output variable. The desired value of the output variable is the Set Point. Another element of the servo is the feedback path, which measures the value of the output variable. Another element of the servo is the Controller. The Controller has a Set Point as an input, which determines the desired value of the output variable. The Controller makes a comparison between the feedback signal and the Set Point and provides the difference to a set of programs. The programs contain models and algorithms used to manage the rate and characteristic profile by making adjustments to the output variable. The last element of the servo is the forward path, which provides the means to change the output variable.

In the case of an optical transceiver, the output variable is the laser power. The feedback is comprised of components such as sensors (like a photodiode sensor), amplifiers and analog to digital converters. The Controller is a signal-processing program, which may be embodied directly in DSP hardware, firmware, an ASIC, a software module executed by a processor, or in any combination of the above. The forward path is comprised of components such as drivers, an Digital to Analog converter, and/or laser diode.

In one embodiment, control parameters are passed through configuration memory. In another embodiment, control parameters are passed via a messaging protocol, and in yet another embodiment control parameters comprise electromagnetic signals.

In step 414, a first servo control function adjusts modulation current as directed by the modulation current control parameters calculated by the DSP analyzer function in step 410. A second servo control function adjusts the bias current as directed by the bias current control parameters calculated by the DSP analyzer function in step 410. Thus, the laser output signal is continuously set to conform to correct signal specifications without interrupting the transmission of data.

Using the basic technique of injecting a noise-level synthesized test signal comparable to the magnitude of the system noise opens a multiplicity of options for compensating the performance of a laser system. In other embodiments, DSP algorithms of step 408 are used to compensate for operational parameters comprising linearity, aging, temperature, and wavelength tuning detection.

Figure 5:
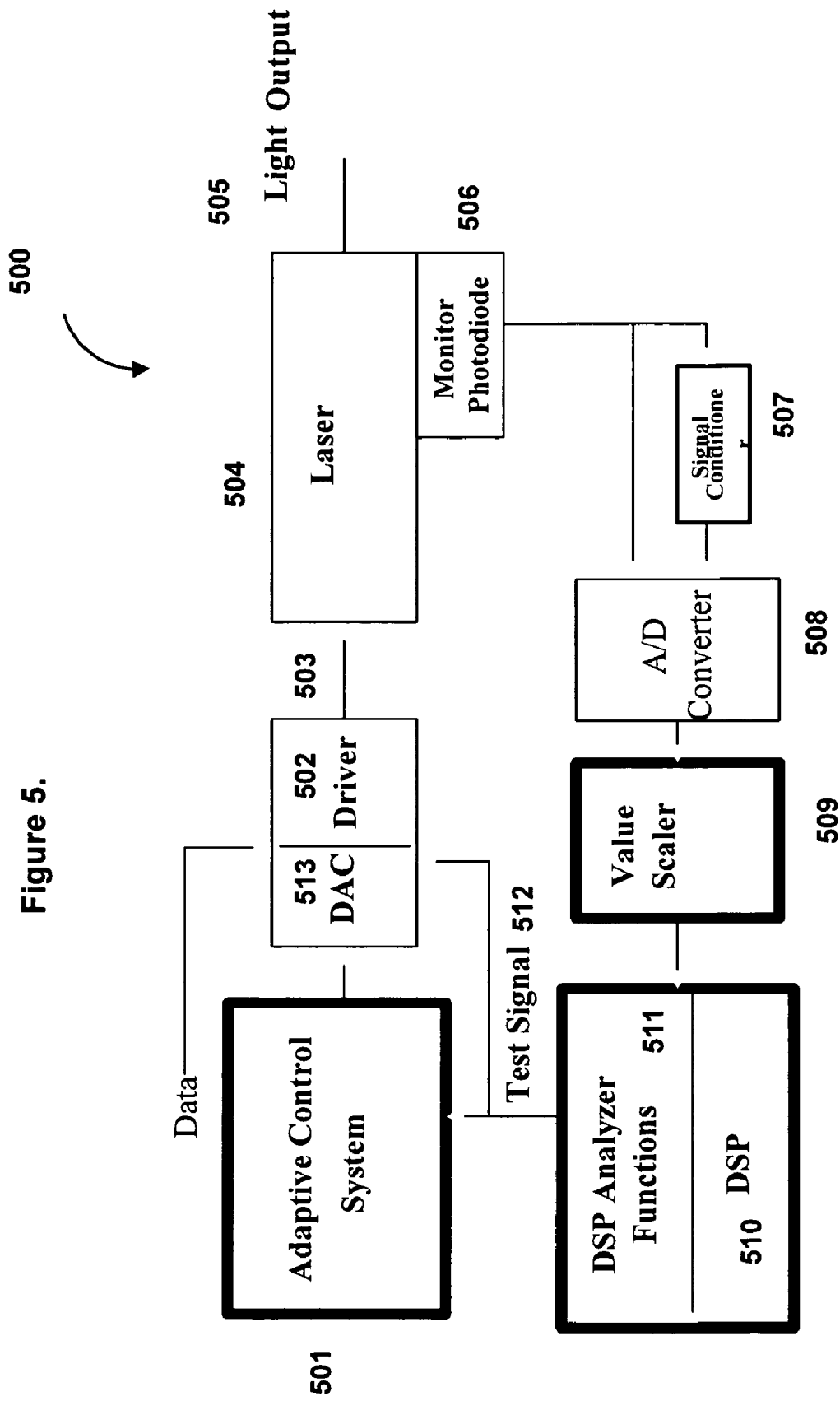
FIG. 5 is a high level apparatus block diagram illustrating digital signal processing methods for laser performance compensation of FIG. 4 embodied in hardware.

FIG. 5 is a high level apparatus block diagram illustrating an exemplary embodiment of the digital signal processing methods for laser performance compensation of FIG. 4 implemented in hardware.

DSP 510 in conjunction with Digital Signal Analyzer Function 511 produces a synthesized Test Signal 512. Digital signal analyzer functionality 511 may be embodied directly in DSP hardware, firmware, an ASIC, a software module executed by a processor, or in any combination of the above. A software module may reside in any form of memory medium known in the art. Synthesized Test Signal 512 may be generated as an analog signal, or as a digital signal and then converted to an analog signal by optional Digital to Analog Converter (DAC) 513. Synthesized Test Signal 512 is applied to a Laser 504 by Driver 502.

Adaptive Control System 501, comprises Servo functionality for instructing Driver 502 to set a specified output power level at Laser 504, determined by Digital Signal Analyzer Functionality 511 in accordance with calculated laser characteristics. Servo functionality may utilize characteristic information stored in a configuration database to correctly determine the correct output power level. Adaptive Control System 501 directs Driver 502 to apply the correct amount of laser input current 503 to Laser 504 in order to produce the desired power level of Light Output 505. Adaptive Control System 501 may be embodied directly in DSP hardware, firmware, an ASIC, a software module executed by a processor, or in any combination of the above.

Monitor Photodiode 506 measures average power of Light Output 505 to provide feedback information to Adaptive Control System 501 for maintaining the correct output power level. Signal Conditioner 507 performs coarse filtering of the noise in the signal sampled by Monitor Photodiode 506 to narrow the monitored signals bandwidth and amplify the frequency band of the noise spectrum, isolating the noise and synthesized test signal from the transmitted signal. A/D Converter 508 digitizes the isolated noise signal for input to Value Scaler 509. Value Scaler 509 is a mechanism by which the magnitude of the values from the recovered noise signal are changed in order to account for variation in components in the control system. Assigning a magnitude to the Value Scaler may be part of a calibration process. Digital Signal Analyzer Function 511 then applies a detection algorithm to the digitized isolated noise signal that recovers the synthesized test signal from the noise.

Once the synthesized test signal is recovered, calculations of the slope efficiency of the laser characteristic along with the threshold inflection point are determined by Digital Signal Analyzer Function 511. New characteristic values of the laser slope efficiency and inflection point can be stored in the configuration database, for use by the servo function in adjusting the power level of Light Output 505 to a continuously corrected value.

In another embodiment of a digital signal processing enhanced method of performance compensation implemented in hardware, Monitor Photodiode 506 is a high frequency response photo diode capable of following the square waves of modulated data. Digital Signal Analyzer Function 511 performs a peak and valley detection algorithm precisely following the Output Modulation Amplitude (OMA) of the transmitted signal. Characteristic values of the laser slope efficiency and inflection point are determined from the peak and valley signal produced by Digital Signal Analyzer Function 511, and used to adjust the power level of Light Output 505 as described above.

Figure 6:
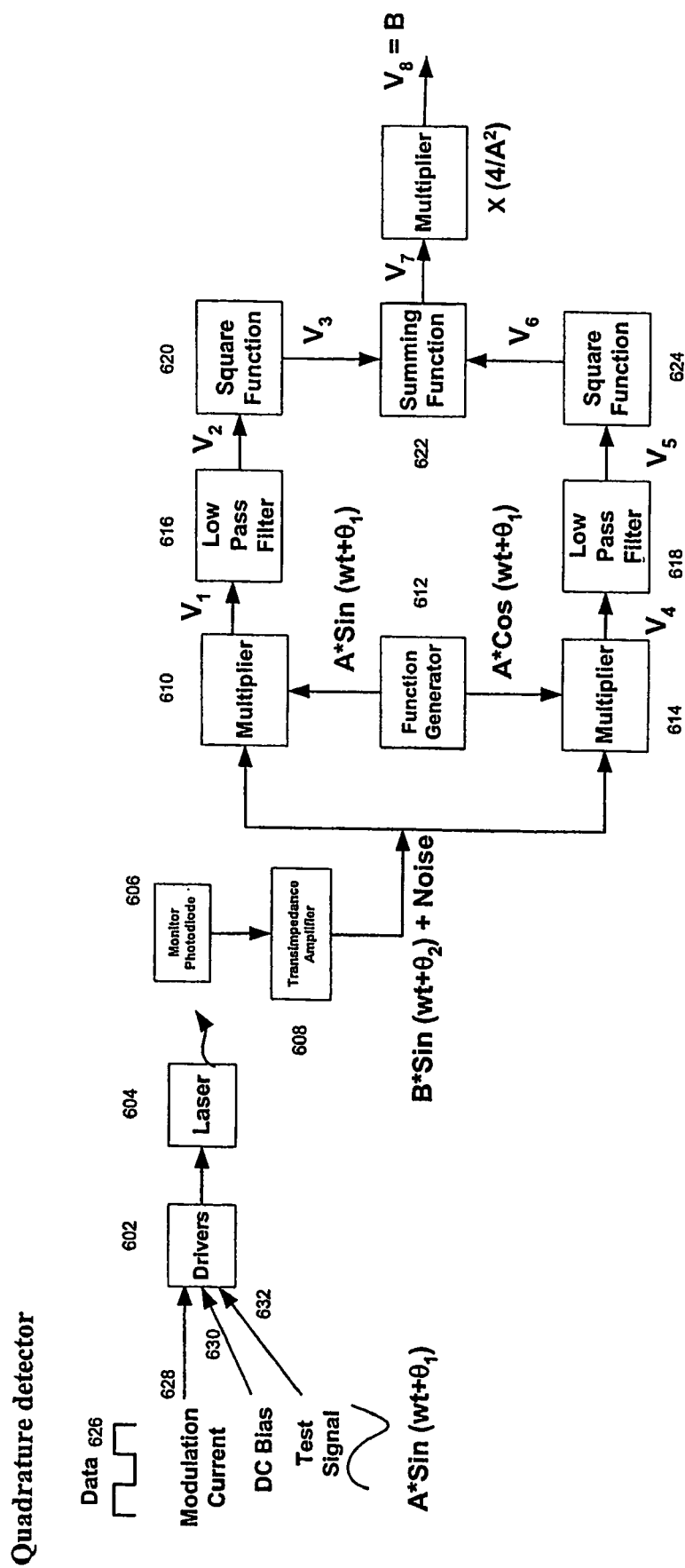
FIG. 6 is a detailed apparatus block diagram illustrating an exemplary method of phase insensitive signal processing laser performance compensation of FIG. 4 embodied in hardware.

FIG. 6 is an exemplary apparatus block diagram illustrating the noise-level test signal quadrature detection disclosed in FIG. 4 embodied directly in hardware. One skilled in the art would readily recognize that any digital signal processing method for detecting, or function for analyzing, a noise-level test signal disclosed herein may be similarly embodied solely in software without departing from the scope of the present invention. FIG. 8 describes the mathematics for the signal processing functions.

Laser Driver 602 applies Modulation Current 628, Bias Current 630 and a noise-level Test Signal 632 embedded in system noise to Laser 604. Monitor Photodiode 606 acquires a portion of Laser 604 Light Output signal containing Data 626 and Test Signal 632. Optional Transimpedance Amplifier 608 amplifies acquired exemplary light output signal:

$$A*Sin(wt+\theta_2)+noise$$

Where B is the amplitude of the recovered sinusoid, w is the angular frequency $\theta_2$ is the angular shift relative to the phase of the applied sinusoid Noise is the amount of noise that the system and the apparatus adds to the signal The signal at the output of the transimpedance amplifier is split into two paths. Multiplier 610 multiplies a first half of the acquired signal by sine term:

$$A*Sin(wt+\theta_1),$$

generated by function generator 612. Multiplier 614 multiplies a second half of the acquired signal by cosine term:

$$A*Cos(wt+\theta_1),$$

likewise generated by another section of function generator 612. The product of Multipliers 610 and 614 permit extraction of the original sinusoidal test signal from system noise and harmonics created by the multiplication. Low pass filter 616 filters high frequency harmonics and noise from the sinusoidal product of Multiplier 610, recovering a sinusoidal test signal. Low pass filter 618 filters high frequency harmonics and noise from the cosinusoidal product of Multiplier 614, recovering a cosinusoidal test signal.

Square Function 620 squares the sinusoidal test signal producing signal:

$$V_3=\{(A^2B^2)/4\}*\{(Cos^2(\theta_2-\theta_1)\}$$

Square Function 624 squares the cosinusoidal test signal producing signal:

$$V_6=\{(A^2B^2)/4\}*\{(Sin^2(\theta_2-\theta_1)\}$$

Summing Function 622 adds the sine squared and cosine squared signals, resulting in $V_7$, the amplitude of the recovered test signal. The amplitude of the recovered test signal, $V_7$, produced by Summing Function 622 is used to calculate adjustments to laser input bias current 630. The recovered test signal $V_7$ is used to calculate adjustments to input modulation current 628. Any method of the present invention may be similarly embodied in software.

Figure 7:
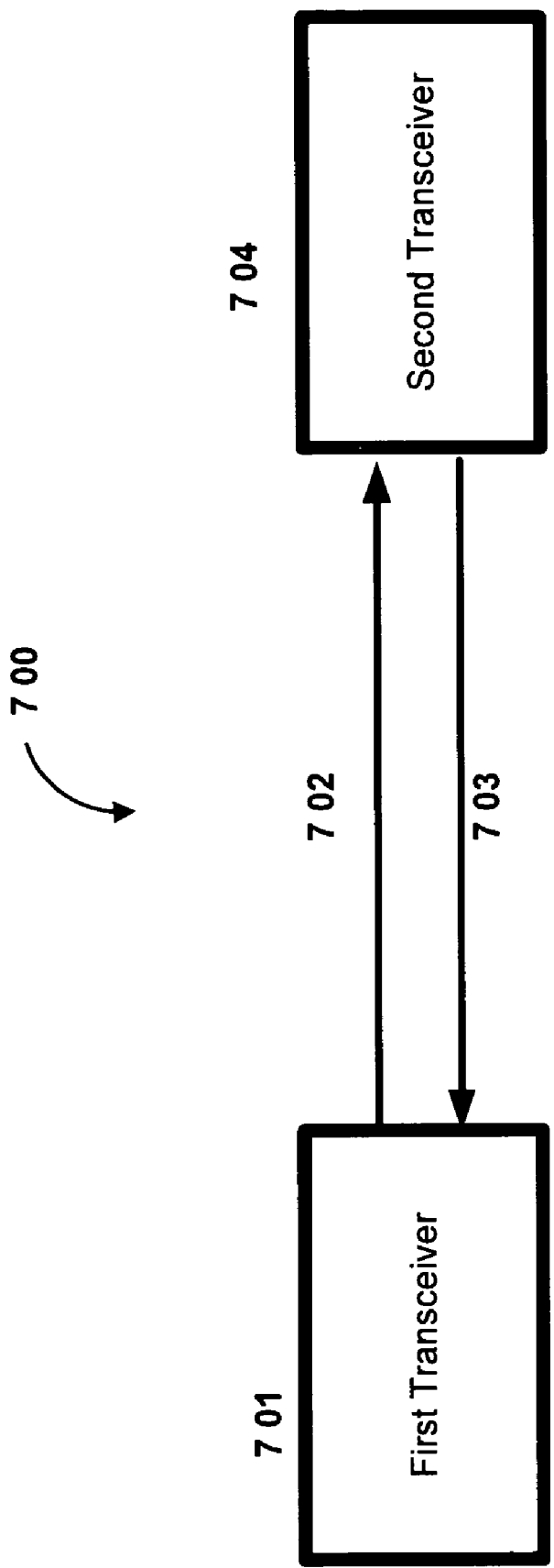
FIG. 7 is a high level block diagram illustrating an optical transmission link method for digital signal processing laser performance compensation in accordance with yet another embodiment of the present invention.

FIG. 7 is a high level block diagram illustrating an optical transmission link method for digital signal processing enhanced laser performance compensation in accordance with yet another embodiment of the present invention. Disclosed embodiments of the present invention advantageously compensate for defects and changing characteristics of a fiber optic link while the link is in operation. Referenced U.S. Pat. No. 6,446,867 describes methods of calibrating a fiber optic link for characteristic parameters using a Digital Controller and transceiver having an internal switch for closing a loop in a fiber optic transmission system. This closed loop enables information about the fiber optic link to be recovered in order to perform necessary adjustments to the laser. The present invention allows these link characterizations and adjustments to be carried out in a fiber optic system while data is simultaneously transmitted.

A first Transceiver 701 and a Second Transceiver 704 comprise appropriate internal architecture of the digital control as described in U.S. Pat. No. 6,446,867 as well as the digital signal processing features detailed in FIGS. 4 and 5. The control system of First Transceiver 701 injects a synthesized test signal, embedded in system noise into the light output of First Transceiver 701.

The synthesized test signal travels through optical fiber 702 and is detected by Second Transceiver 704, where the signal is recovered by an embodiment of the digital signal processing detection and recovery method described above. The Digital Controller in Second Transceiver 704 may detect the received synthesized test signal through a lock-in phase sensitive, quadrature phase insensitive, or linear sweep algorithm used to detect a test signal embedded in system noise as described in FIGS. 4 and 5.

The information regarding the characteristic of the received signal is sent back to the First Transceiver 701 such that the laser in First Transceiver 701 is adjusted to compensate for issues in the fiber optic link 702, optimizing signal transmission. Second Transceiver 704 may also send information regarding the measurement of the received signal back to the First Transceiver 701 using the same technique.

One skilled in the art will understand that the ordering of steps illustrated in FIGS. 4 through 7 are not limiting. The methods are readily amended by omission or re-ordering of the steps illustrated without departing from the scope of the disclosed embodiments.

Thus, novel and improved methods and apparatus for Digital Signal Processing enhanced laser performance compensation have been described. Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any digital signal processor, conventional processor, controller, PC, external computer, server, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. In another alternative, the processor and the storage medium may reside as discrete components on a printed circuit board.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method for controlling a laser, the method comprising:
generating a data signal;
generating a test signal having a level commensurate with a noise level;
modulating a laser bias current with both the test signal and the data signal to produce a modulated laser output;
generating a modulated laser signal from the modulated laser output;
multiplying the modulated laser signal by a sine function of the test signal to generate a first product;
squaring the first product to generate a first squared product;
multiplying the modulated laser signal by a cosine function of the test signal to generate a second product;
squaring the second product to generate a second squared product;
adding the first squared product and the second squared product to generate an extracted test signal;
determining an average value of the extracted test signal;
calculating a laser bias current adjustment from the average value of the extracted test signal; and
applying the calculated laser bias current adjustment to the laser bias current.

2. The method of claim 1, wherein the test signal is a sinusoidal signal.

3. The method of claim 1, wherein the test signal is a saw tooth signal.

4. The method of claim 1, further comprising:
calculating a modulation current adjustment from the extracted test signal; and
applying the calculated modulation current adjustment to the laser.

5. A system comprising: means for generating a data signal; means for generating a test signal having a level commensurate with a noise level; means for modulating a laser bias current with both the test signal and the data signal to produce a modulated laser output, and for applying a calculated laser bias current adjustment to the laser bias current; means for generating a modulated laser signal from the modulated laser output; means for multiplying the modulated laser signal by a sine function of the test signal to generate a first product; means for squaring the first product to generate a first squared product; means for multiplying the modulated laser signal by a cosine function of the test signal to generate a second product; means for squaring the second product to generate a second squared product; means for adding the first squared product and the second squared product to generate an extracted test signal; means for determining an average value of the extracted test signal; means for calculating the laser bias current adjustment from the average value of the extracted test signal.

6. The system of claim 5, wherein the means for generating the test signal generates a sinusoidal signal.

7. The system of claim 5, wherein the means for generating the test signal generates a saw tooth signal.

8. The system of claim 5, wherein the means for calculating the laser bias current calculates a modulation current adjustment from the extracted test signal; and the means for modulating a laser bias current applies the calculated modulation current adjustment to the laser.

* * * * *